US009482727B2

(12) United States Patent
Choi et al.

(10) Patent No.: US 9,482,727 B2
(45) Date of Patent: Nov. 1, 2016

(54) MAGNETIC RESONANCE IMAGING (MRI) APPARATUS AND MANUFACTURING METHOD THEREOF

(71) Applicant: Samsung Electronics Co., Ltd., Gyeonggi-do (KR)

(72) Inventors: Seung Je Choi, Gyeonggi-do (KR); Dong Keun Park, Gyeonggi-do (KR); Gyu Wan Hwang, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 632 days.

(21) Appl. No.: 13/954,344

(22) Filed: Jul. 30, 2013

(65) Prior Publication Data

US 2014/0084929 A1 Mar. 27, 2014

(30) Foreign Application Priority Data

Sep. 24, 2012 (KR) .................. 10-2012-0105718

(51) Int. Cl.
*G01R 33/385* (2006.01)
*G01R 33/565* (2006.01)
*G01R 33/28* (2006.01)
*G01R 33/00* (2006.01)
*G01R 33/38* (2006.01)
*G01R 33/381* (2006.01)

(52) U.S. Cl.
CPC ........... *G01R 33/28* (2013.01); *G01R 33/0052* (2013.01); *G01R 33/381* (2013.01); *G01R 33/3802* (2013.01); *G01R 33/3858* (2013.01); *G01R 33/56518* (2013.01); *Y10T 29/49004* (2015.01)

(58) Field of Classification Search
CPC ................. Y10T 29/490004; G01R 33/3858; G01R 33/28; G01R 33/3802
See application file for complete search history.

(56) References Cited

U.S. PATENT DOCUMENTS

2006/0038566 A1 2/2006 Kimmlingen et al.
2013/0229182 A1* 9/2013 Denoth .............. G01R 33/4215
324/319

FOREIGN PATENT DOCUMENTS

JP 2000-333929 A 12/2000

OTHER PUBLICATIONS

JP 2000-333929 a Machine Translation obtained on Mar. 18, 2016.*

* cited by examiner

*Primary Examiner* — Gregory H Curran
(74) *Attorney, Agent, or Firm* — Cha & Reiter, LLC

(57) ABSTRACT

A magnetic resonance imaging (MRI) method and apparatus in which conductors are installed in the space between a static coil unit and a gradient coil unit to eliminate asymmetry of eddy current induced in the static coil unit. The structure permits a symmetrical distribution of eddy current when the concentric arrangement of the static coil unit and gradient coil unit has deviated. The MRI apparatus includes: a static coil unit configured to form a static field in a subject; a gradient coil unit configured to form a gradient field in the static field; and one or more conductors installed in the space between the static coil unit and the gradient coil unit, and configured to symmetrically distribute eddy current induced in the static coil unit.

18 Claims, 16 Drawing Sheets

MAGNETIC RESONANCE IMAGING (MRI) APPARATUS AND MANUFACTURING METHOD THEREOF

CLAIM OF PRIORITY

This application claims the benefit of priority under 35 U.S.C. §119 from Korean Patent Application No. 10-2012-0105718, filed on Sep. 24, 2012 in the Korean Intellectual Property Office, the disclosure of which is incorporated herein by reference in its entirety.

BACKGROUND

1. Field of the Invention

The present disclosure relates to a magnetic resonance imaging (MRI) apparatus for diagnosing various diseases using MRI, and a manufacturing method thereof.

2. Description of the Related Art

In general, a medical imaging system is an apparatus for providing imaging information about an internal area of a patient. The medical imaging system includes an X-ray machine, an ultrasonic diagnostic instrument, a computer tomography (CT) scanner, a magnetic resonance imaging (MRI) apparatus, etc.

The MRI apparatus holds an important position in the field of medical imaging diagnosis because image-taking conditions are relatively free and the MRI apparatus can provide excellent delectability and various diagnosis information images with respect to soft tissue.

The MRI causes nuclear magnetic resonance (NMR) in the hydrogen atomic nuclei of the human body through the use of a magnetic field that is harmless to humans and RF, which is non-ionizing radiation, to thus image the densities and physical or chemical characteristics of the atomic nuclei.

In more detail, the MRI apparatus supplies a specific frequency and energy to atomic nuclei in the state in which a constant magnetic field has been applied to the atomic nuclei, in order to cause the atomic nuclei to release energy, and the MRI apparatus converts the energy released from the atomic nuclei to signals, thereby being able to visually diagnose the inside of the human body.

When a magnetic field is applied, protons configuring atomic nuclei are arranged in the direction of the magnetic field because the protons have spin angular momentum and magnetic dipole moment, and the atomic nuclei perform precession with respect to the direction of the magnetic field. The precession causes nuclear magnetic resonance so that an image of the inside human body can be acquired through the nuclear magnetic resonance.

Meanwhile, the MRI apparatus applies a gradient field to a static field formed in a subject to thus acquire an image of the subject. In order to form a gradient field in a static field, it is necessary to supply a pulse-type current to a gradient coil unit.

If a pulse-type current is applied to the gradient coil unit, eddy current flows through a static coil unit for forming a static field in the subject, due to electromagnetic induction. The eddy current induced in the static coil unit also induces a magnetic field that obstructs acquisition of normal images, resulting in degradation of image quality.

Accordingly, in order to avoid degradation of image quality due to such eddy current flowing through a static coil unit for forming a static field in the subject, there is a need in the art for a technology capable of suppressing the influence of the eddy current.

SUMMARY

Therefore, an aspect of the present invention provides a magnetic resonance imaging (MRI) apparatus in which conductors are installed in the space between a static coil unit and a gradient coil unit to eliminate asymmetry of eddy current induced in the static coil unit, so that the eddy current has a symmetrical distribution, and a manufacturing method of the MRI apparatus.

Additional aspects of the invention will be set forth in part in the description which follows and, may also be learned by practice of the invention.

In accordance with one exemplary aspect of the present invention, a magnetic resonance imaging (MRI) apparatus can include: a static coil unit configured to form a static field in a subject; a gradient coil unit configured to form a gradient field in the static field; and one or more conductors installed in a space between the static coil unit and the gradient coil unit, and configured for symmetrical distribution of eddy current induced in the static coil unit.

The one or more conductors can be installed in an asymmetrical space that occurs when the gradient coil unit deviates from a reference state in which the gradient coil unit forms a concentric body with the static coil unit, thereby adjusting the magnitude of the eddy current induced in the static coil unit. In other words, when the gradient coil shifts from the position (reference state) where a concentric body is formed with the static coil unit, the magnitude of the eddy current in the static coil unit is adjusted.

The one or more conductors can be installed in an excessive space that is made when the gradient coil unit deviates from a reference state in which the gradient coil unit forms a concentric body with the static coil unit, thereby adjusting the magnitude of eddy current induced in a portion of the static coil unit, the portion corresponding to the excessive space.

In addition, the portion of the static coil unit corresponding to the excessive space can include an area in which the space between the gradient coil unit and the static coil unit is widened when the gradient coil unit has deviated from the reference state.

The one or more conductors can be installed at a location for symmetrically distributing the magnitude of eddy current induced in the static coil unit and asymmetrically distributed in at least one direction among x-, y-, and z-axis directions.

The one or more conductors can be constructed of at least one material from among copper (Cu), aluminum (Al), and stainless steel (SUS).

The static coil unit may include one or more installation units in which the conductors are installed.

At least one of the size and number of the conductors can be determined based on the results of measurement on the eddy current induced in the static coil unit.

The one or more conductors can be installed in an area of the static coil unit in which a measured magnitude of eddy current is smaller than a magnitude of eddy current measured at another area of the static coil unit, and the smaller magnitude of the eddy current measured in the area or the larger size of the area results in the larger size of the one or more conductors that are installed in the area or in a larger quantity of the conductors.

The shape of the one or more conductors can be decided based on the shape of an area in which the conductors are installed.

In accordance with another exemplary aspect of the present invention, a manufacturing method of a magnetic resonance imaging (MRI) apparatus can include: measuring eddy current formed in a static coil unit; determining a location at which one or more conductors are to be installed in order to form a symmetrical distribution of the eddy current induced in the static coil unit, based on the result of the measurement; and installing the conductors in the decided location.

The installation location of the conductors can include an asymmetrical space that occurs when the gradient coil unit deviates from a reference state in which the gradient coil unit forms a concentric body with the static coil unit.

The installation location of the conductors can include an excessive space between the gradient coil unit and the static coil unit, the excessive space occurs when the gradient coil unit deviates from a reference state in which the gradient coil unit forms a concentric body with the static coil unit.

The excessive space can include an area in which the space between the gradient coil unit and the static coil unit is widened when the gradient coil unit has deviated from the reference state.

The installation location of the one or more conductors can include an area of the static coil unit in which a smaller magnitude of eddy current is measured in an asymmetrical distribution of eddy current of the static coil unit, the asymmetrical distribution appearing in at least one direction among x-, y-, and z-axis directions.

The conductors can be constructed from at least one material such as copper (Cu), aluminum (Al), and stainless steel (SUS).

The static coil unit may include one or more installation units in which the conductors are installed, and the installing of the conductors in the determined location may include installing the conductors in the installation units of the magnetic coil unit, installed in the determined installation location.

At least one of the size and number of the conductors for forming the symmetrical distribution of the eddy current induced in the static coil unit can be decided based on the results of the measurement.

The determining of the at least one of the size and number of the conductors may include increasing the size or number of the conductors that are installed in the installation location, as a smaller magnitude of eddy current is measured in the installation location of the conductors is determined based on the result of the measurement, or as the installation location is determined to be a larger area.

The manufacturing method of the MRI apparatus can include determining the shape of the conductors according to a shape of the installation location of the conductors decided based on the result of the measurement.

According to an exemplary aspect of the present invention, by installing conductors in areas from which a small magnitude of eddy current is measured to increase the eddy current in the areas, asymmetry of an eddy current distribution, generated due to surface treatment errors of a static coil unit or setup errors of the static coil unit and a gradient coil unit, can be eliminated so that the eddy current can be symmetrically distributed.

In addition, for the reason that the eddy current induced in the static coil unit has a symmetrical distribution by the conductors installed between the static coil unit and the gradient coil unit, the efficiency of an existing pre-emphasis method cannot compensate for influence of an asymmetrical eddy current distribution, or of a method of removing artifacts of eddy current through image postprocessing can be increased.

In addition, the present invention advantageously prevents degradation of image quality due to influence of eddy current.

BRIEF DESCRIPTION OF THE DRAWINGS

The aforementioned and/or other exemplary aspects of the invention will become more apparent and better-appreciated by a person of ordinary skill in the art from the following description(s) of the invention, taken in conjunction with the accompanying drawings of which.

DETAILED DESCRIPTION

Figure 1:
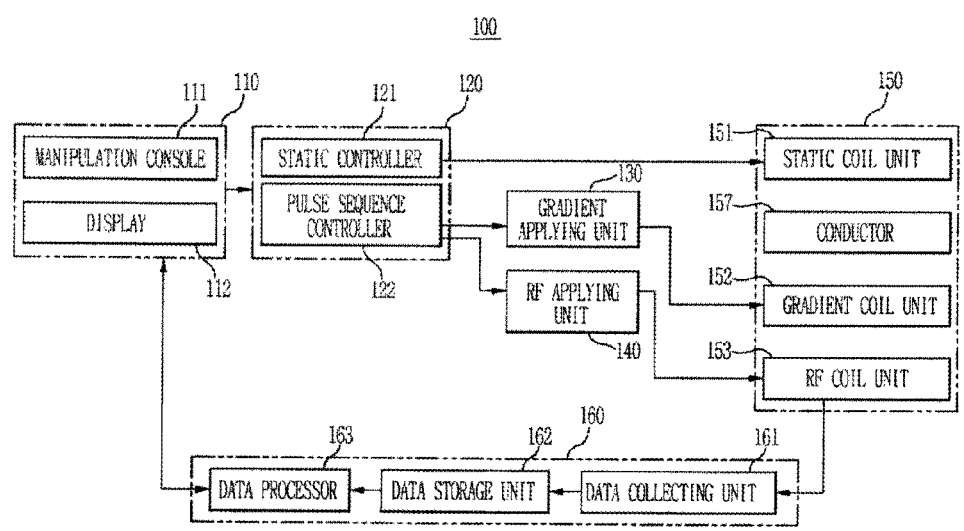
FIG. 1 is a control block diagram of a magnetic resonance imaging (MRI) apparatus in accordance with an exemplary embodiment of the present invention.

Reference will now be made in detail to some of the exemplary embodiments of the present invention, examples of which are illustrated in the accompanying drawings, wherein like reference numerals refer to like elements throughout.

FIG. 1 is a control block diagram of a magnetic resonance imaging (MRI) apparatus 100 in accordance with an embodiment of the present invention;

Referring now to FIG. 1, the MRI apparatus 100 in accordance with this exemplary embodiment of the present invention includes a magnet assembly 150 for forming a magnetic field to cause resonance in atomic nuclei, a controller 120 for controlling the operation of the magnet assembly 150, and an image processor 160 for receiving an echo signal generated from the atomic nuclei to create a magnetic resonance image.

The magnet assembly 150 includes a static coil unit 151 for forming a static field thereinside, a gradient coil unit 152 for forming a gradient field in the static field, one or more conductors 157 arranged in a space between the static coil unit 151 and the gradient coil unit 152, and an RF coil unit 153 for applying an RF pulse to excite atomic nuclei and receiving an echo signal from the atomic nuclei.

The controller 120, which in this example includes a static controller 121 for controlling the strength and direction of a static field that is formed by the static coil unit 151, and a pulse sequence controller 122 for designing a pulse sequence and controlling the gradient coil unit 152 and the RF coil unit 153 according to the pulse sequence.

Also, the MRI apparatus 100 shown in FIG. 1 includes a gradient applying unit 130 for applying a gradient signal to the gradient coil unit 152, and a RF applying unit 140 for applying an RF signal to the RF coil unit 153, so that the pulse sequence controller 122 controls the gradient applying unit 130 and the RF applying unit 140 to adjust a gradient field that is formed in a static field and RF that is applied to atomic nuclei.

In addition, the MRI apparatus 100 can include a user manipulation unit 110 to receive a control command regarding the operation of the MRI apparatus 100 from a user, and particularly, the user manipulation unit 110 may receive a command regarding a scan sequence from a user to create a pulse sequence according to the control command.

Figure 2:
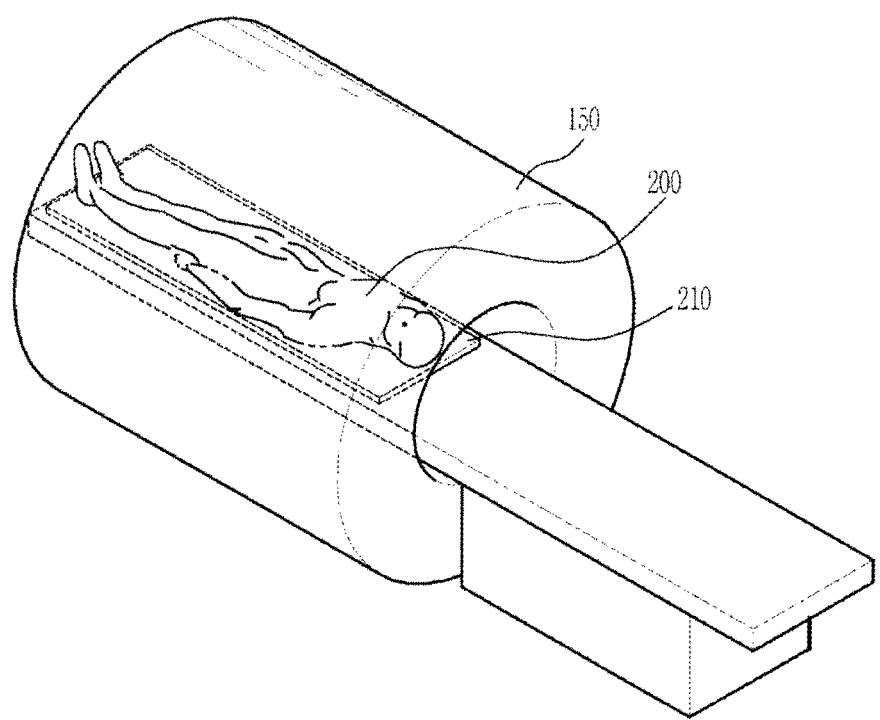
FIG. 2 illustrates a perspective view of the appearance of an MRI apparatus.

The user manipulation unit 110 can also include a manipulation console 111 for allowing a user to manipulate the MRI apparatus 100, and a display 112 for displaying a control state and displaying an image created by the image processor 160 in order for the user to diagnose the health status of a subject 200 (shown in FIG. 2).

Figure 3:
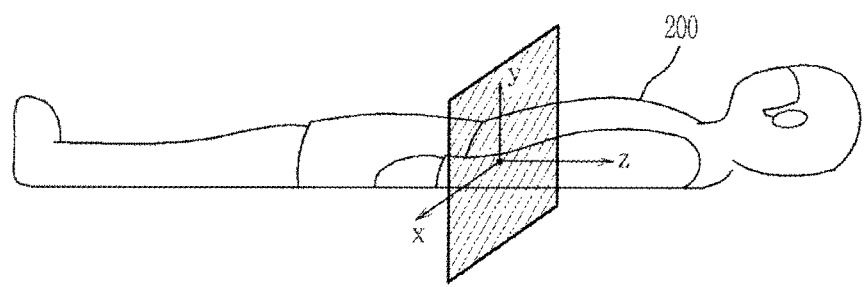
FIG. 3 shows a subject lying in a space divided to x, y, and z axes.
Figure 4:
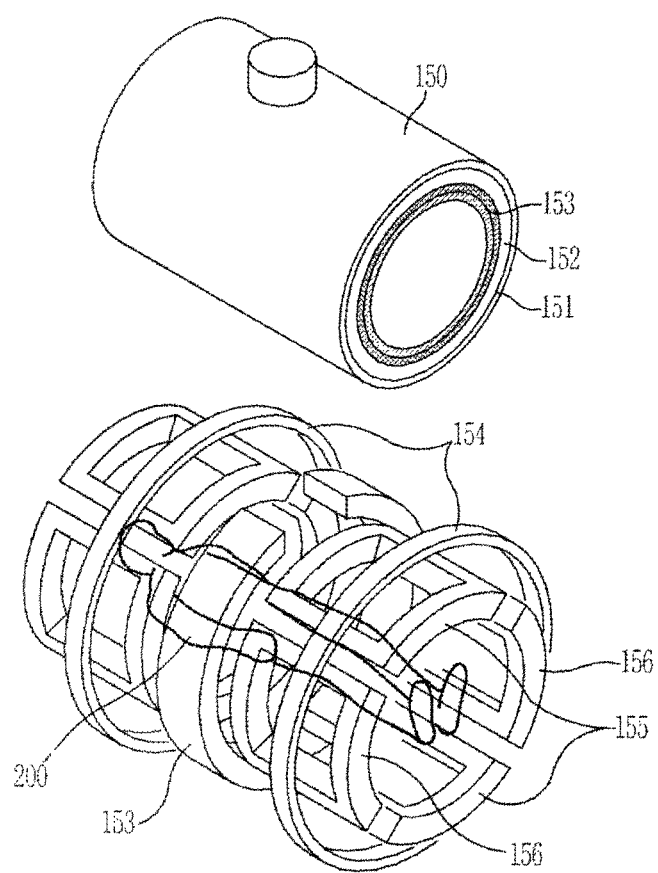
FIG. 4 illustrates the structures of a magnet assembly and a gradient coil unit.
Figure 5:
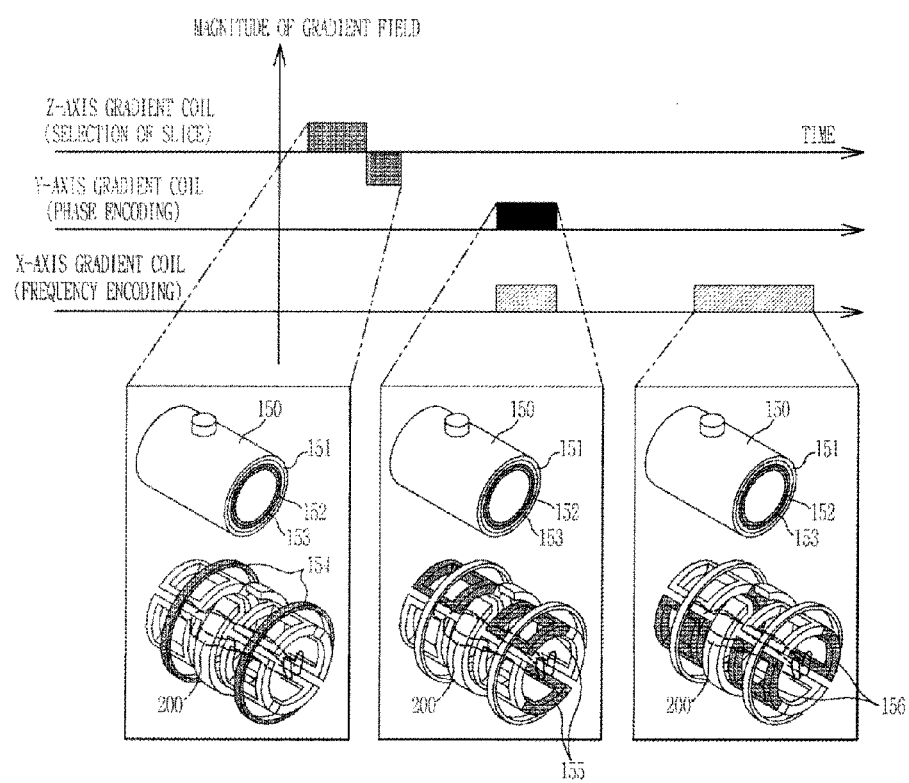
FIG. 5 shows individual gradient coils that configure the gradient coil unit and pulse sequences related to operation of the individual gradient coils.

FIG. 2 schematically shows the appearance of the MRI apparatus 100, FIG. 3 shows the subject lying in a space divided to x, y, and z axes, FIG. 4 shows the structures of the magnet assembly 150 and the gradient coil unit 152, FIG. 5 shows individual gradient coils configuring the gradient coil unit 152 and pulse sequences related to operation of the individual gradient coils.

Hereinafter, the operation of the MRI apparatus 100 will now be described in more detail with reference to FIGS. 1 through 5.

The magnet assembly 150 is constructed in the shape of a hollow cylinder, and the inside space of the magnet assembly 150 is referred to as the "cavity". A transfer unit moves the subject 200 lying thereon to the cavity in order to obtain a magnetic resonance signal.

The magnet assembly 150 preferably includes, as described above, the static coil unit 151, the gradient coil unit 152, and the RF coil unit 153.

The static coil unit 151 can have a structure in which coils are wound around the cavity of the magnet assembly, and if a current is applied to the static coil unit 151, a static field is formed inside the magnet assembly 150, that is, inside the cavity.

The direction of the static field is generally parallel to the concentric axis of the magnet assembly 150.

When the static field is formed in the cavity, the atomic nuclei of atoms (specifically, hydrogen atoms) configuring the subject 200 are arranged in the direction of the static field, and perform precession with respect to the direction of the static field. The precession speed of the atomic nuclei may be expressed as a precession frequency, which is called a Larmor frequency, and may be represented by equation 1, below.

$$\omega = \gamma B_0, \qquad (1)$$

wherein $\omega$ is the Larmor frequency, $\gamma$ is a proportional constant, and $B_0$ is the strength of an external magnetic field. The proportional constant $\gamma$ depends on the kind of atomic nuclei, the strength of the external magnetic field $B_0$ is measured in units of Tesla (T) or Gauss (G), and the precession frequency is measured in units of Hz.

For example, hydrogen protons have a precession frequency of 42.58 MHz in an external magnetic field of 1 T. Since hydrogen atoms constitute a main portion of atoms configuring the human body, an MRI acquires a magnetic resonance signal using the precession of hydrogen protons.

The gradient coil unit 152 generates a gradient in the static field formed in the cavity to form a gradient field.

As shown in FIG. 3, an axis parallel to the up and down direction from head to feet of the subject 200, that is, an axis parallel to the direction of the static field can be determined as the z-axis, and an axis parallel to the left and right direction of the subject 200 can be determined as the x-axis, and an axis parallel to the up and down direction in the 3-dimensional (3D) space may be determined as the y-axis.

In order to obtain 3D spatial information, gradient fields with respect to all of the x-, y-, and z-axes are required. Accordingly, the gradient coil unit 152 includes three pairs of gradient coils.

As shown in FIGS. 4 and 5, the z-axis gradient coils 154 are configured with a pair of ring-shaped coils, and y-axis gradient coils 155 are positioned above and below the subject 200. Also, x-axis gradient coils 156 are positioned on the left and right sides of the subject 200.

If direct currents having opposite polarities flow through the respective z-axis gradient coils 154, a change of a magnetic field in the z-axis direction occurs so that a gradient field is formed. FIG. 5 shows a pulse sequence corresponding to a z-axis gradient field formed when the z-axis gradient coils 154 are operating. Since the greater gradient of the gradient field formed in the z-axis direction enables the thinner slice to be selected, the z-axis gradient coils 154 are used to select a slice.

If a slice is selected through the gradient field formed by the z-axis gradient coils 154, spins configuring the corresponding slice have the same frequency and phase, so that the individual spins cannot be distinguished from each other.

In this state where the slice selected through the gradient field formed by the z-axis gradient coils configuring the corresponding slice have the same frequency and phase, if a gradient field in the y-axis direction is formed by the y-axis gradient coils 155, the y-axis gradient field causes phase shift such that the rows of the slice have different phases.

In other words, if the y-axis gradient field is formed, the phases of the spins of rows to which the greater gradient field has been applied change to the higher frequencies, and the phases of the spins of rows to which the smaller gradient field has been applied change to the lower frequencies. Thereafter, if the y-axis gradient field disappears, a phase shift occurs in the individual rows of the selected slice so as for the rows to have different phases, so that the rows can be distinguished from each other. As such, the gradient field formed by the y-axis gradient coils 155 is used for phase encoding. FIG. 5 also shows a pulse sequence corresponding to the y-axis gradient field formed when the y-axis gradient coils 155 operate.

In summary, a slice is selected through the gradient field formed by the z-axis gradient coils 154, and rows configuring the selected slice are distinguished in such a manner to have different phases through the gradient field formed by the y-axis gradient coils 155. However, spins configuring each row still cannot be distinguished since they have the same frequency and phase.

In this state, if a gradient field in the x-axis direction is formed by the x-axis gradient coils 156, the x-axis gradient field causes spins configuring each row to have different frequencies such that the spins can be distinguished from each other. As such, the gradient field formed by the x-axis gradient coils 156 is used for frequency encoding.

As described above, the gradient fields respectively formed by the z-, y-, and x-axis gradient coils spatially encode the spatial locations of individual spins through slice selection, phase encoding, and frequency encoding.

With continued reference to at least FIGS. 4 and 5, the gradient coil unit 152 is connected to the gradient applying unit 130, and the gradient applying unit 130 applies a driving signal to the gradient coil unit 152 according to a control signal received from the pulse sequence controller 122 to generate gradient fields. The gradient applying unit 130 can include three driving circuits in correspondence to three types of gradient coils 154, 155, and 156 configuring the gradient coil unit 152.

As described above, atomic nuclei arranged by an external magnetic field perform precession at the Larmor frequency, and a sum of magnetization vectors of some atomic nuclei may be represented as a net magnetization "M".

The z-axis component of the net magnetization M cannot be measured, and only $M_{xy}$ can be detected. Accordingly, in order to obtain a magnetic resonance signal, the atomic nuclei should be excited so that a net magnetization M exists on the xy plane. For excitation of atomic nuclei, it is necessary to apply a RF pulse tuned to the Larmor frequency of the atomic nuclei to the static field.

The RF coil unit 153 includes a transmission coil for transmitting the RF pulse, and a reception coil for receiving electromagnetic waves, in other words, a magnetic resonance signal released from excited atomic nuclei.

With reference to FIG. 1, the RF coil unit 153 is connected to the RF applying unit 140, and the RF applying unit 140 applies a driving signal to the RF coil unit 153 according to a control signal received from the pulse sequence controller 122 to drive the RF coil unit 153 to transmit the RF pulse.

The RF applying unit 140 can include a modulation circuit for modulating a high frequency output signal to a pulse type signal, and an RF power amplifier for amplifying the pulse type signal.

Also, the RF coil unit 153 is connected to the image processor 160, and the image processor 160 can include a data collecting unit 161 for receiving data regarding a magnetic resonance signal generated from atomic nuclei, and a data processor 163 for processing data collected by the data collecting unit 161 to create a magnetic resonance image. The aforementioned processors contain circuitry such as integrated circuits.

The data collecting unit 161 includes a preamplifier for amplifying the magnetic resonance signal received by the reception coil of the RF coil unit 153, a phase detector for receiving the magnetic resonance signal from the preamplifier to detect the phase of the magnetic resonance signal, and an A/D converter for converting the analog signal acquired by the phase detection to a digital signal. Also, the data collecting unit 161 transmits the digitalized magnetic resonance signal to a data storage unit 162.

In the data storage unit 162, which comprises a non-transitory machine readable medium, a data space configuring a 2D Fourier space is formed, and after scanned data is all stored in the data storage unit 162, the data processor 163 performs 2D Inverse-Fourier Transform on data in the 2D Fourier space to reconfigure an image about the subject 200. The reconfigured image is displayed on the display 112.

As a method for acquiring a magnetic resonance signal from atomic nuclei, a spin echo pulse sequence has been widely used. For example, if the RF coil unit 153 sequentially applies two RF pulses with a predetermined time interval "Δt" in between, strong transverse magnetization occurs in atomic nuclei when the time interval Δt has again elapsed, and a magnetic resonance signal may be acquired through the strong transverse magnetization. This method is called a spin echo pulse sequence. A time period taken until the magnetic resonance signal is generated from when the first RF pulse has been applied is the time echo (TE).

A degree at which protons have been flipped can be represented as an angle at which the protons have moved away from an axis on which they have been positioned before being flipped, and the corresponding RF pulse may be represented as a 90° RF pulse, a 180° RF pulse, etc., according to the degree of flip.

Figure 6:
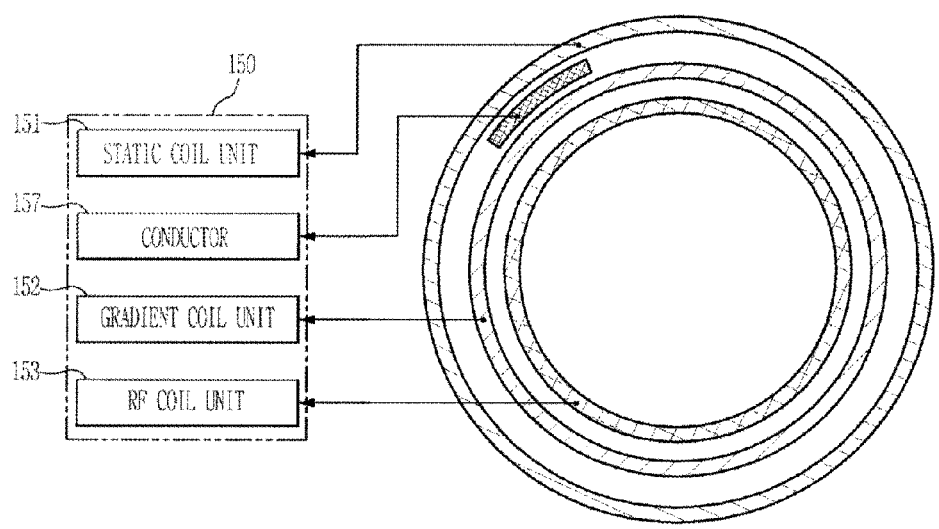
FIG. 6 is a view showing cross-section of a magnet assembly of FIG. 1 in detail.

FIG. 6 is a view showing the magnet assembly 150 of FIG. 1 in detail.

Referring now to FIG. 6, the MRI apparatus 100 (see FIG. 1) includes a conductor 157 installed in the space between the static coil unit 151 and the gradient coil unit 152.

When the gradient coil unit 152 is driven, an eddy current is induced in the conductor 157 adjacent to the gradient coil unit 152 by electromagnetic induction. The eddy current is mainly induced in the static coil unit 151, more specifically, in the thermal shield or vacuum vessel of the static coil unit 151.

The induced eddy current in the static coil unit forms a magnetic field by electromagnetic induction, and the magnetic field influences a static field formed in a subject, specifically, in a field of view (FOV) which is an image-taking area of the subject.

In order to acquire a readable image regarding a subject, a static field has to be formed in a FOV. However, the magnetic field induced by the eddy current influences the static field, thus degrading the quality of an image regarding the subject.

In order to suppress influence of such eddy current, a pre-emphasis method has been conventionally used. The pre-emphasis method modulates a pulse sequence in advance for cancelling influence of eddy current.

Since the pre-emphasis method has been designed under an assumption that eddy current induced in the static coil unit 151 is symmetrically distributed in all directions of up, down, left, and right, the pre-emphasis method does not efficiently cancel influence of eddy current when there are setup errors of the static coil unit 151 and the gradient coil unit 152, or when eddy current induced in the static coil unit 151 has an asymmetrical distribution due to surface treatment errors that may be generated upon manufacturing of the static coil unit 151.

However, the MRI apparatus 100 according to the present exemplary embodiment can efficiently cancel influence of eddy current through the pre-emphasis method by installing the conductor 157 in the space 158 (see FIG. 7) between the static coil unit 151 and the gradient coil unit 152 so that the eddy current induced in the static coil unit 151 is symmetrically distributed. Hereinafter, this will be described in more detail with reference to FIGS. 7 through 15.

Figure 7:
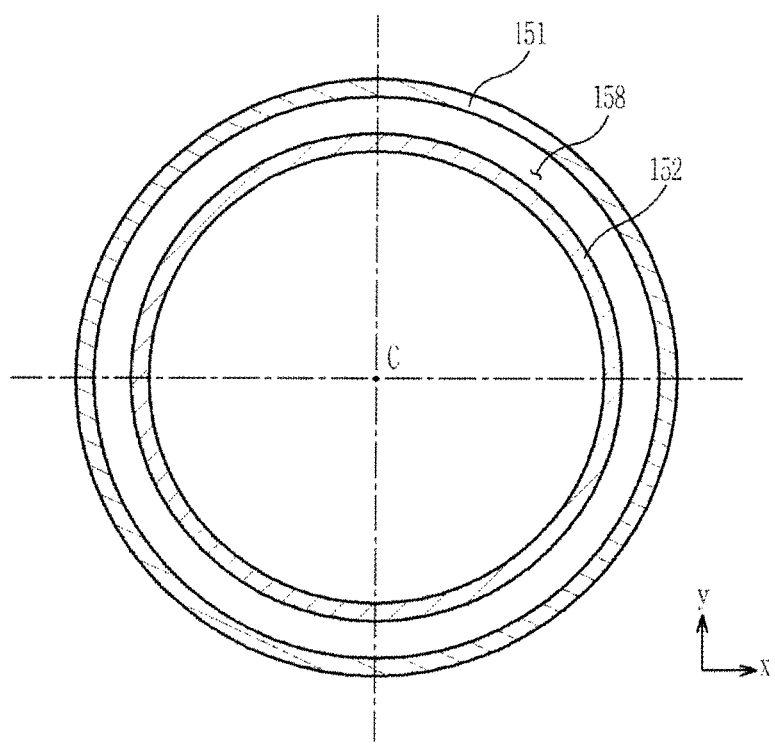
FIG. 7 is a cross-sectional view conceptually showing a reference state in which a static coil unit and a gradient coil unit form a concentric body.
Figure 8:
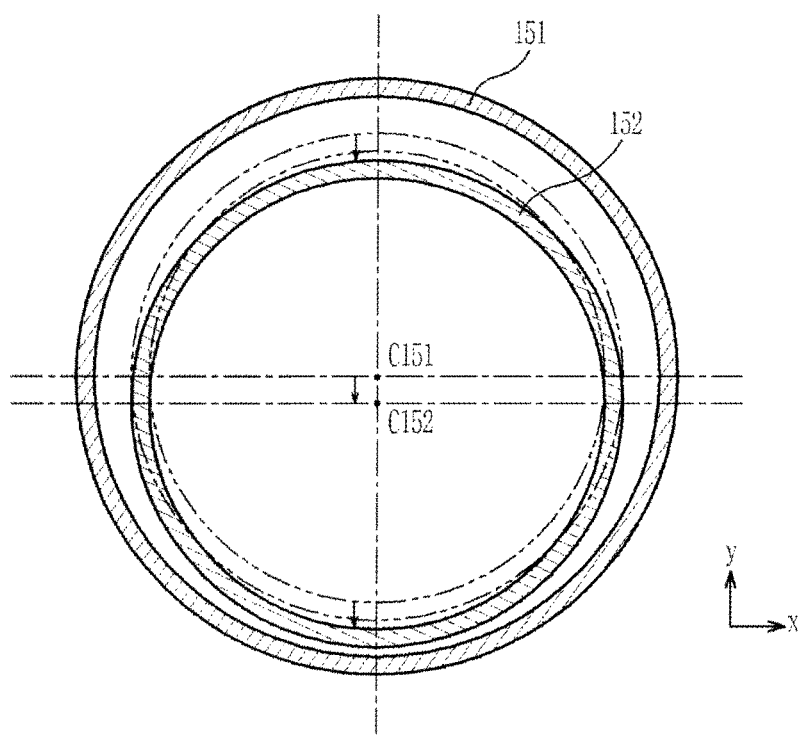
FIG. 8 is a cross-sectional view conceptually showing a state in which the position of gradient coil unit has deviated from the reference state shown in FIG. 7.
Figure 9:
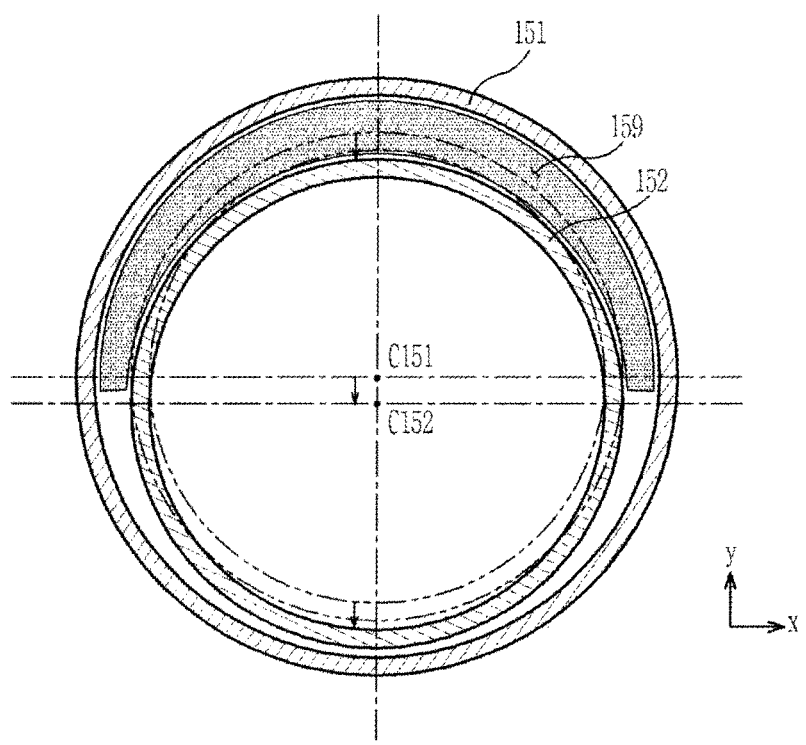
FIG. 9 is a cross-sectional view conceptually showing an asymmetrical space that occurs when the gradient coil unit has deviated from the reference state.
Figure 10:
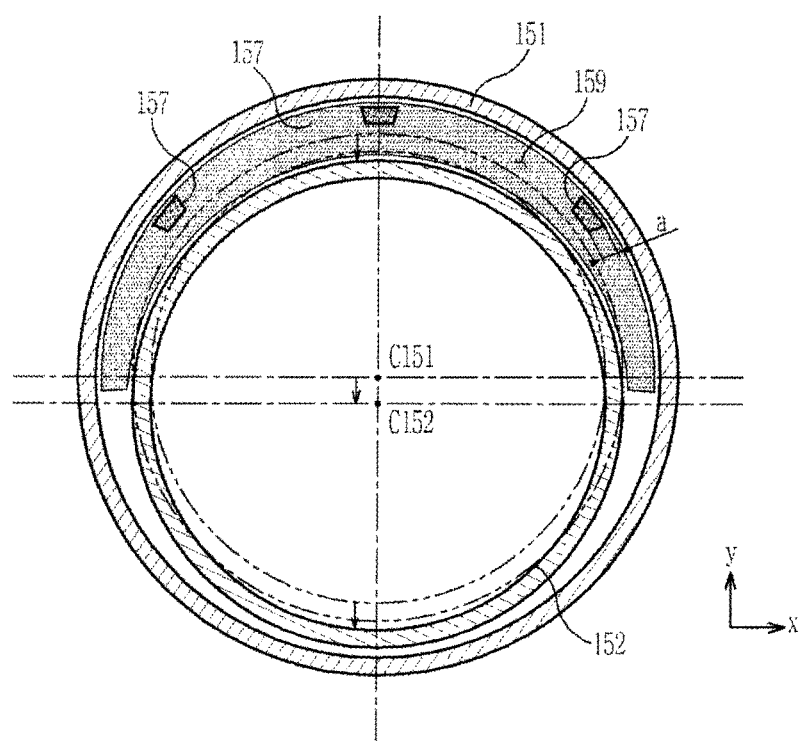
FIG. 10 is a cross-sectional view conceptually showing a structure in which conductors have been disposed in the asymmetrical space between the static coil unit and the gradient coil unit of the MRI apparatus.

FIG. 7 is a cross-sectional view conceptually showing a reference state in which the static coil unit 151 and the gradient coil unit 152 form a concentric body, FIG. 8 is a cross-sectional view conceptually showing a state in which the gradient coil unit 152 has deviated from the reference state shown in FIG. 7 and thus the reference state no longer constitutes a true concentric body, FIG. 9 is a cross-sectional view conceptually showing an asymmetrical space made when the gradient coil unit 152 has deviated from the reference state, and FIG. 10 is a cross-sectional view conceptually showing a structure in which conductors 157 have been installed in the asymmetrical space between the static coil unit 151 and the gradient coil unit 152 of the MRI apparatus 100 (see FIG. 1) to correct for the effects of the deviation in the reference state.

Figure 13:
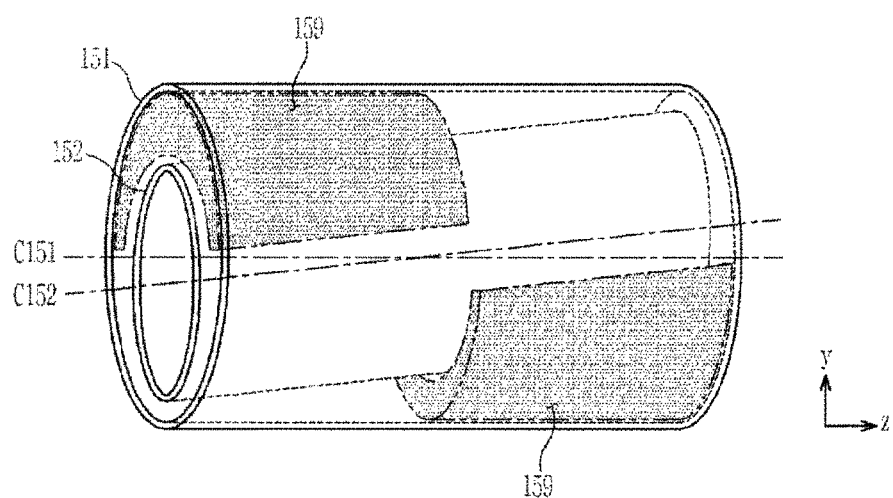
FIG. 13 is a perspective view conceptually showing asymmetrical spaces made when the gradient coil unit has deviated from the reference state.
Figure 14:
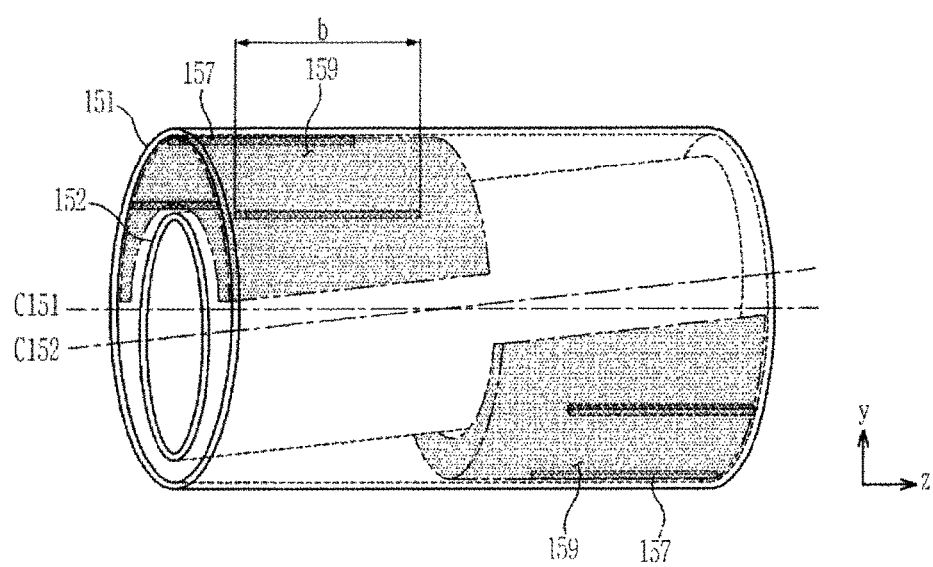
FIG. 14 is a perspective view conceptually showing a structure in which conductors have been installed in the asymmetrical spaces between the static coil unit and the gradient coil unit of the MRI apparatus.
Figure 15:
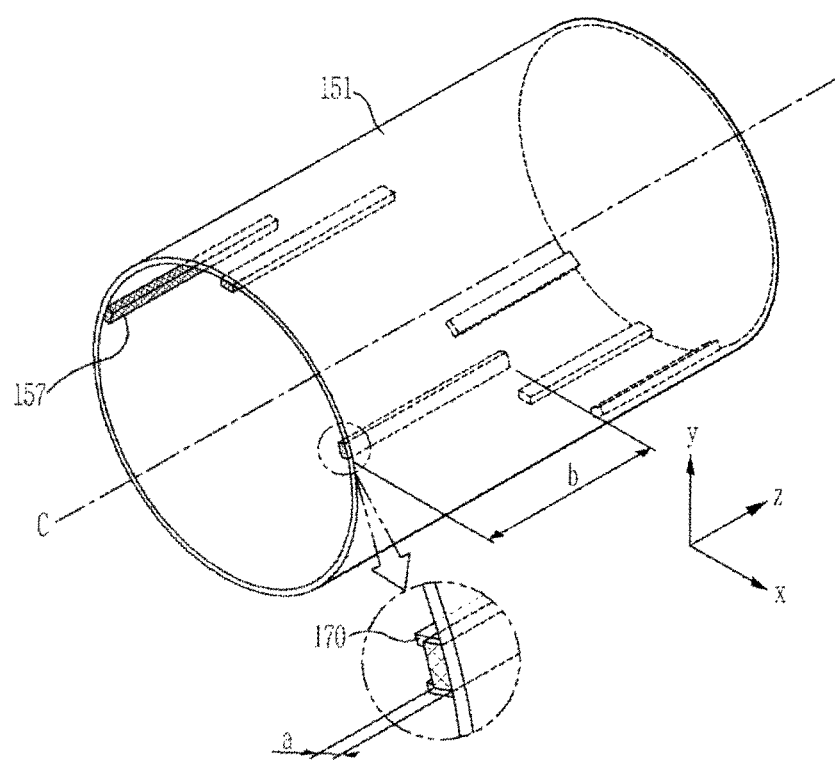
FIG. 15 is a perspective view conceptually showing a structure in which the conductors have been arranged on the static coil unit of the MRI apparatus.

FIGS. 11 through 14 are perspective views 3-dimensionally showing the cross-sectional views shown in FIGS. 7 through 10, respectively, and FIG. 15 is a perspective view conceptually showing a structure in which the conductors 157 have been arranged on the static coil unit 151 of the MRI apparatus 100 according to this exemplary embodiment of the present invention.

Referring now to FIG. 7, the static coil unit 151 and the gradient coil unit 152 form a concentric body whose central axis shares the central axis "C" of the cavity. In the following description, the state in which the static coil unit 151 and the gradient coil unit 152 form a concentric body will be referred to as a reference state. Also, for convenience of description, the other components (for example, the RF coil unit 153) of the magnet assembly 150, except for the static coil unit 151 and the gradient coil unit 152, are not shown.

In an ideal configuration, as shown in FIG. 7, the gradient coil unit 152 should be installed inside the static coil unit 151 such that it forms a perfectly concentric body with the static coil unit 151 to be maintained in the reference state. However, there are often errors in such a configuration because of the substantially difficultly to form and maintain a completely concentric shape without error.

With continued reference to FIG. 7, here is the space 158 between the static coil unit 151 and the gradient coil unit 152, and when the static coil unit 151 and the gradient coil unit 152 form a concentric body as shown in FIG. 7 so that they are in the reference state, the width of the space 158 is approximately, in this particular example, 5 mm.

FIG. 8 shows a state in which the static coil unit 151 and the gradient coil unit 152 have different central axes C151 and C152 because the gradient coil unit 152 has deviated from the reference state so that it cannot form a concentric body with the static coil unit 151.

FIG. 8 shows the case in which the central axis C152 of the gradient coil unit 152 is positioned below the central axis C151 of the static coil unit 151, however, this arrangement is only exemplary. In other words, the gradient coil unit 152 may be positioned at an arbitrary location at which a concentric body cannot be formed with the static coil unit 151. Also, for convenience of description, the state in which the gradient coil unit 152 has deviated from the reference state is more or less exaggeratedly shown, but the setup error between the static coil unit 151 and the gradient coil unit 152 may be actually very smaller than that shown in FIG. 8.

In FIG. 8, the position of the gradient coil unit 152 when it is in the reference state is shown by dotted lines, and the position of the gradient coil unit 152 after deviating from the reference state is shown by solid lines.

FIG. 8 is a cross-sectional view showing the magnet assembly 150 on the xy plane, and the rear portion of the gradient coil unit 152, which is raised in the up direction when the central axis C152 of the gradient coil unit 152 moves lower than the central axis C151 of the static coil unit 151, has been not shown for convenience of description, which will be seen in the corresponding perspective view (see FIG. 12) as described later.

As such, if the gradient coil unit 152 has deviated from the reference state, the shape of the space 158 between the static coil unit 151 and the gradient coil unit 152 also changes.

As also shown in FIG. 8, if the gradient coil unit 152 has deviated from the concentric structure and moved in the down direction, the lower space becomes narrower than the space 158 in the reference state, and the upper space becomes wider than the space 158 in the reference state, so that an asymmetrical space is formed.

In FIG. 9, the widened space is shaded with a dark gray color to be distinguished from the narrowed space for easy understanding of the asymmetrical space. In order to easily describe the widened space of the asymmetrical space, the widened space will be referred to as an "excessive space" 159.

When the static coil unit 151 and the gradient coil unit 152 are in the reference state as shown in FIG. 7, the magnitude of eddy current induced in the static coil unit 151 is symmetrically distributed in the x-, y-, and z-axis directions. The reason for the symmetrical distribution is because the static coil unit 151 and the gradient coil unit 152 form a concentric body so that the distance between the static coil unit 151 and the gradient coil unit 152 is uniform.

However, if the static coil unit 151 and the gradient coil unit 152 are deviated from the reference state as shown in FIGS. 8 and 9, the distance between the static coil unit 151 and the gradient coil unit 152 becomes non-uniform. In other words, the distance is longer in the excessive space 159, and shorter in the other space. Accordingly, the magnitude of the eddy current induced in the static coil unit 151 is asymmetrically distributed.

In other words, a smaller magnitude of eddy current than that induced in the reference state is induced in a portion of the static coil unit 151, corresponding to the excessive space 159, and a greater magnitude of eddy current than that induced in the reference state is induced in the other portion of the static coil unit 151, corresponding to the other space.

The asymmetrical distribution in magnitude of the eddy current disables the pre-emphasis method to efficiently cancel the eddy current because the pre-emphasis method of modulating a pulse sequence in advance has been designed under an assumption that a spatial distribution in magnitude of eddy current is symmetrical.

For this reason, the MRI apparatus 100 according to this exemplary embodiment of the present invention installs conductors 157 in the space 158 between the static coil unit 151 and the gradient coil unit 152, as shown in FIG. 10, so that eddy current induced in the static coil unit 151 has a symmetrical distribution.

FIG. 10 shows a structure in which three conductors 157 have been installed in the asymmetrical space.

Hereinafter, spatial non-uniformity in arrangement of the static coil unit 151 and the gradient coil unit 152 will be described as an exemplary factor causing asymmetry of eddy current distribution. However, there are various other factors causing asymmetry of eddy current distribution.

Also, the number and locations of the conductors 157 as shown in FIG. 10 are only exemplary, and a different quantity of conductors 157 may be arranged at different locations in the asymmetrical space between the static coil unit 151 and the gradient coil unit 152.

As described above, if the static coil unit 151 and the gradient coil unit 152 are deviated from the reference state, a smaller magnitude of eddy current than that induced in the reference state is induced in a portion of the static coil unit 151, corresponding to the excessive space 159, and a greater magnitude of eddy current than that induced in the reference state is induced in the other portion of the static coil unit 151, corresponding to the other space, resulting in asymmetry of the eddy current distribution, and thus lack of cancellation of the eddy current as occurs in the reference state.

The problem of asymmetry of eddy current distribution can be overcome by adjusting the magnitude of eddy current asymmetrically distributed by an asymmetrical space. For example, it is possible to restore symmetry of the eddy current distribution by increasing the magnitude of eddy current induced in a portion of the static coil unit 151, corresponding to the excessive space 159 of the asymmetrical space.

In other words, if the conductors 157 are disposed in the excessive space 159 as shown in FIG. 10, eddy current is induced in the conductors 157 due to electromagnetic induction, and the eddy current induced in the conductors 157 is added to eddy current induced in a portion of the magnetostatic coil unit 151, corresponding to an area in which the conductors 157 are disposed, thus increasing the magnitude of eddy current induced in the static coil unit 151.

Accordingly, if the conductors 157 are installed in the excessive space 159, the magnitude of eddy current induced in a portion of the static coil unit 151, corresponding to the excessive space 159, increases so that eddy current of the excessive space 159 can have a symmetrical distribution with eddy current induced in the other space.

Locations at which the conductors 157 are arranged may be determined as being at which eddy current induced in the static coil unit 151 is asymmetrically distributed, when the eddy current is measured and a distribution of the eddy current is obtained.

For example, if the magnitude of eddy current measured at a certain area is smaller than the magnitude of eddy current measured at another area symmetrical to the area, the corresponding area may be determined to be an area at which the conductors 157 have to be disposed. The area may belong to the excessive area 159 that is made when the static coil unit 151 and the gradient coil unit 152 are deviated from the reference state. As described above, since the asymmetrical distribution of eddy current is not necessarily made only when the static coil unit 151 and the gradient coil unit 152 are deviated from the reference state, the conductors 157 may be installed at arbitrary locations in the asymmetrical space between the static coil unit 151 and the gradient coil unit 152, as well as the excessive space 159, as long as the asymmetry of the eddy current distribution can be eliminated by installing the conductors 157 at the locations.

Also, the quantity (number) of the conductors 157 used may depend on the number of locations at which eddy current is asymmetrically distributed. If asymmetrical distributions of eddy current have been checked from a plurality of locations on the static coil unit 151, conductors 157 corresponding to the number of the checked locations may be installed at the corresponding locations in order to restore the asymmetrical distributions of the eddy current at the corresponding locations to symmetrical distributions.

After the locations and number of the conductors 157 are determined, the number or size of conductors 157 that are to be installed at each location may be determined.

Since the smaller magnitude of eddy current is measured at a location at which a conductor 157 is to be installed, the higher eddy current has to be added to the corresponding location, the size of a conductor 157 which is to be installed at a location may be determined according to the magnitude of eddy current measured at the corresponding location.

According to the test results, when the thickness (a) of conductors 157 is 1 mm and the length (b) of the conductors 157 is 30 mm (see FIGS. 10 and 14), an eddy current is induced in the conductors 157 that was measured to be 4 to 5 times higher than eddy current induced in the thermal shield of the static coil unit 151. Accordingly, if the magnitude of eddy current that has to be added for restoring a symmetrical distribution of eddy current is calculated, the size of conductors 157 can be determined based on data acquired according to the test results.

Also, the sizes or shapes of conductors 157 may be determined according to areas on which the conductors 157 are to be installed, or the numbers of the conductors 157 which are to be installed at the individual areas may be determined.

In order to cover each area, a single conductor 157 can be installed at the corresponding location, however, it is also possible to position a plurality of conductors 157 each having a predetermined size at each location in order to distributively cover an area of the corresponding location.

Also, the conductors 157 can be formed in the shape of a flat plate or in the shape of a curved structure according to the shapes of areas on which the conductors 157 are installed. In the current exemplary embodiment, since the static coil unit 151 is in the shape of a cylinder, the conductors 157 each may be fabricated in the shape of a curved structure having a curvature equal or similar to that of the static coil unit 151 and arranged on the static coil unit 151 if the conductors 157 are installed over a wide area.

As described above, if eddy current of the static coil unit 151 is measured, and areas at which the eddy current is asymmetrically distributed are determined, the installation locations, size, shape, number, etc. of the conductors 157 are determined such that symmetry of the eddy current distribution can be restored by the installation of the conductors.

The conductors 157 may be made of, for example, aluminum (Al), copper (Cu), stainless steel (SUS), etc. However, materials that can be used for fabricating the conductors 157 are not limited to the above-mentioned materials, as at best the above materials are a preference.

Also, to install the conductors 157 easily, the installation units 170 in which the conductors 157 can be installed may be formed on the static coil unit 151. The installation units 170 will be described in more detail with reference to FIG. 15, herein after.

FIGS. 11 through 14, which are perspective views corresponding to the cross-sectional views shown in FIGS. 7 through 10, respectively, show the structure of the magnet assembly (150 of FIG. 4) when seen from the side.

Figure 11:
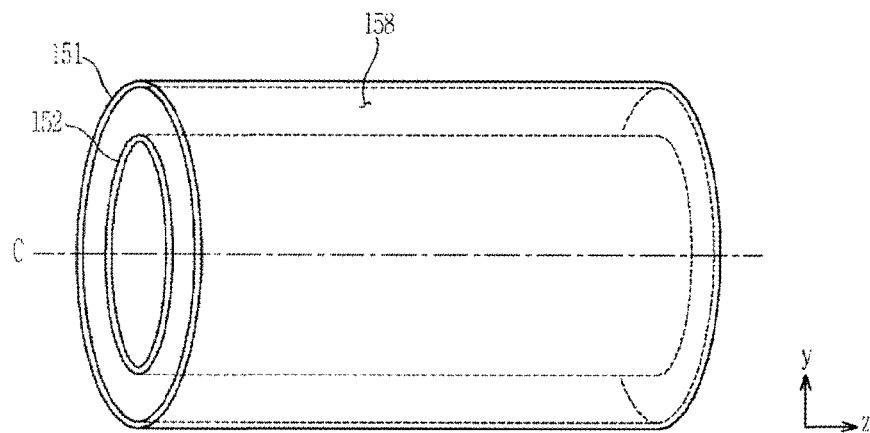
FIG. 11 is a perspective view conceptually showing the reference state in which the static coil unit and the gradient coil unit form a concentric body.

Referring now to FIG. 11, the static coil unit 151 and the gradient coil unit 152 form a concentric body whose central axis shares the central axis "C" of the cavity so that they are in the reference state.

Ideally, as shown in FIG. 11, the gradient coil unit 152 should be installed inside the static coil unit 151 such that it forms a concentric body with the static coil unit 151 to be maintained in the reference state. However, there are sometimes errors in construction since it is substantially difficult to form a completely concentric shape without error.

Figure 12:
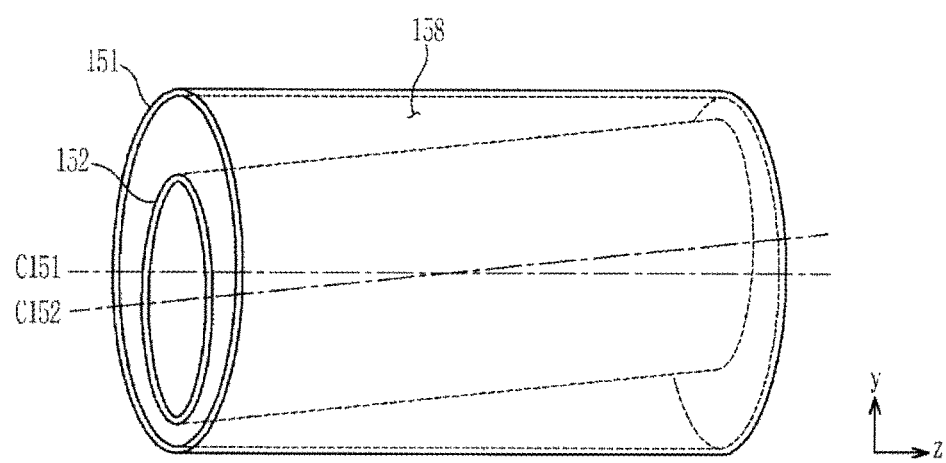
FIG. 12 is a perspective view conceptually showing a state in which the gradient coil unit has deviated from the reference state shown in FIG. 11.

FIG. 12 shows a state in which the static coil unit 151 and the gradient coil unit 152 have different central axes C151 and C152 since the gradient coil unit 152 has deviated from the reference state such that the gradient coil does not form a concentric body with the static coil unit 151.

FIG. 12 shows an exemplary case in which the central axis C152 of the gradient coil unit 152 is inclined in the y-axis direction. However, a person or ordinary skill in the art should understand and appreciate that both the direction and the degree of inclination is only exemplary for illustrative purposes, and the claimed invention is not limited based on this illustration to show a non-concentric arrangement. In other words, the gradient coil unit 152 may be positioned at any arbitrary location at which it cannot form a concentric body with the static coil unit 151, and the deviation can be different than shown and described. Also, for convenience of description, the state in which the gradient coil unit 152 is deviated from the reference state is more or less exaggerated for illustrative purposes, but the setup error between the static coil unit 151 and the gradient coil unit 152 may be actually very smaller than that shown in FIG. 8 (and FIG. 12).

FIG. 8 is a cross-section view showing the magnet assembly 150 on the xy plane, and the rear portion of the gradient coil unit 152, which is raised in the up direction when the central axis C152 of the gradient coil unit 152 moves lower than the central axis C151 of the static coil unit 151, has been not shown for convenience of description. The rear portion of the gradient coil unit 152 can be seen from FIG. 12.

As such, in the case where the gradient coil unit 152 has deviated from the reference state, the shape of the space 158 between the static coil unit 151 and the gradient coil unit 152 also changes.

As shown in FIG. 12, in the case where the gradient coil unit 152 has deviated from the concentric body and moved in the down direction, the lower space becomes narrower than the space 158 (FIG. 11) in the reference state, in the left part, and is widened toward the right, whereas the upper space becomes wider than the space 158 in the reference state, in the left part, and is narrowed toward the right.

Now referring to FIG. 13, the widened spaces, that is, the excessive spaces 159 are shaded with a dark gray color to be distinguished from the narrowed spaces for easy understanding of the asymmetrical space.

When the static coil unit 151 and the gradient coil unit 152 are in the reference state as shown in FIG. 11, the magnitude of eddy current induced in the static coil unit 151 is symmetrically distributed in the x-, y-, and z-axis directions. The reason for the symmetrical distribution of the eddy current is because the static coil unit 151 and the gradient coil unit 152 form a concentric body so that the distance between the static coil unit 151 and the gradient coil unit 152 is uniform.

However, in the case the static coil unit 151 and the gradient coil unit 152 are deviated from the reference state as shown in FIGS. 12 and 13, the distance between the static coil unit 151 and the gradient coil unit 152 becomes non-uniform, thereby forming asymmetrical spaces. In other words, the distance is longer in the excessive spaces 159, and shorter in the other spaces. Accordingly, the magnitude of eddy current induced in the static coil unit 151 is asymmetrically distributed.

Accordingly, a smaller magnitude of eddy current is induced in portions of the static coil unit 151 than the magnitude of the eddy current induced in the reference state, corresponding to the excessive spaces 159, and a greater magnitude of eddy current than that induced in the reference state is induced in portions of the static coil unit 151, corresponding to the other spaces.

FIG. 14 shows a non-limiting example in which three conductors 157 are installed in each asymmetrical space.

However, the number and locations of the conductors 157 as shown in FIG. 14, like FIG. 10, are only exemplary, and a different number of conductors 157 may be installed at different locations in the asymmetrical spaces between the static coil unit 151 and the gradient coil unit 152.

As described above, if the static coil unit 151 and the gradient coil unit 152 have deviated from the reference state, a smaller magnitude of eddy current is induced in portions of the static coil unit 151, corresponding to the excessive spaces 159 than would be induced in the reference state, and a greater magnitude of eddy current is induced in the other portions of the static coil unit 151 than is induced in the reference state, corresponding to the other spaces, resulting in asymmetry of the eddy current distribution.

The problem of asymmetry of eddy current distribution can be overcome by adjusting the magnitude of eddy current asymmetrically distributed by the asymmetrical spaces. For example, the present invention recognizes it is possible to restore symmetry of an eddy current distribution by increasing the magnitude of eddy current induced in portions of the static coil unit 151, corresponding to the excessive spaces 159 of the asymmetrical spaces.

More particularly, if the conductors 157 are installed in the excessive spaces 159 as shown in FIG. 14, eddy current is induced in the conductors 157 due to electromagnetic induction, and the eddy current induced in the conductors 157 is added to eddy current induced in portions of the magnetostatic coil unit 151, corresponding to areas in which the conductors 157 are installed, thus increasing the magnitude of eddy current induced in the static coil unit 151.

As such, if conductors 157 are installed in the excessive spaces 159, the magnitude of eddy current induced in portions of the static coil unit 151, corresponding to the excessive spaces 159, increases such that the eddy current of the excessive spaces 159 can have a symmetrical distribution with eddy current induced in the other spaces, despite the non-concentric arrangement of the gradient coil and static coil.

The installation locations, number, size, and shape of the conductors 157 have been described above, and accordingly, a detailed description thereof will be omitted.

FIG. 15 shows an example in which the conductors 157 are arranged on the static coil unit 151, and for convenience of description, the gradient coil unit 152 is not shown.

Referring now to FIG. 15, the conductors 157 are arranged in the space between the gradient coil unit 152 and the static coil unit 151, specifically, on the inner wall of the static coil unit 151 to increase the magnitude of eddy current that is induced in the static coil unit 151.

According to test results, when the thickness (a) of conductors 157 is, for example, 1 mm and the length (b) of the conductors 157 is, for example, 30 mm (see FIGS. 10 and 14), eddy current induced in the conductors 157 was measured to be 4 to 5 times higher than eddy current induced in the thermal shield of the static coil unit 151. Accordingly, if the magnitude of eddy current that has to be added for restoring a symmetrical distribution of eddy current is calculated, the size of conductors 157 can be determined based on data acquired according to the test results.

Also, for ease in installing the conductors 157, installation units 170 (FIG. 15) in which the conductors 157 can be installed may be formed on the static coil unit 151. As shown in an enlarged part of FIG. 15, the installation units 170 may be formed as insertion grooves having a cross section in the shape of "⌐ ⌐", into which conductors 157 can be inserted and which can support the conductors 157 while exposing the conductors 157. However, this arrangement is only exemplary, and the installation units 170 may be implemented as various other structures. In FIG. 15, for convenience of description, and clearly showing the installation units 170, the installation units 170 are shown only in the enlarged part.

Figure 16:
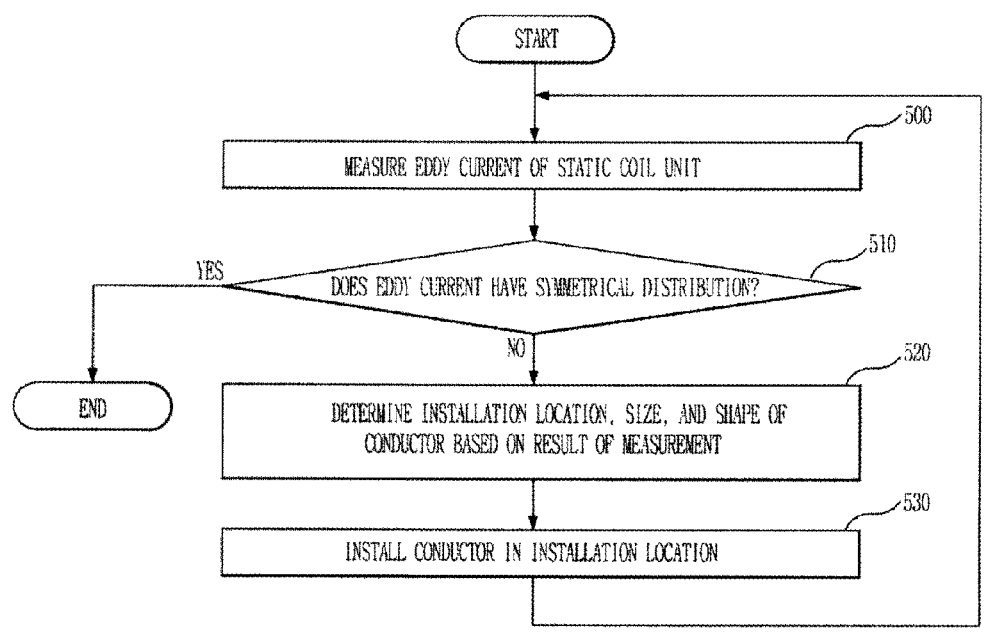
FIG. 16 is a flowchart showing exemplary operation of a manufacturing method of the MRI apparatus in accordance with an exemplary embodiment of the present invention.

FIG. 16 is a flowchart showing exemplary operation of a manufacturing method of the MRI apparatus 100 (see FIG. 1), in accordance with an exemplary embodiment of the present invention.

Referring now to FIGS. 1 and 16, first, at (S500) eddy current induced in the static coil unit 151 is measured.

If the gradient coil unit 152 is driven, eddy current is induced in the conductors 157 adjacent to the gradient coil unit 152 by electromagnetic induction, and the eddy current is mainly induced in the static coil unit 151.

By measuring the eddy current induced in the static coil unit 151, a distribution in magnitude of the eddy current induced in the static coil unit 151 is calculated.

After the eddy current is measured to calculate the distribution in magnitude of the eddy current at (S500), then at (S510) there is a determination as to whether the measured eddy current has a symmetrical distribution.

If at (S520) it is determined that the eddy current does not have a symmetrical distribution, then at (S520) the installation locations of the conductors 157 are determined based on the results of the measurement, and the size, shape, and number of the conductors 157 that are to be installed in the determined installation locations are determined.

When the gradient coil unit 152 and the static coil unit 151 have deviated from a reference state as described above, the space between the gradient coil unit 152 and the static coil unit 151 forms an asymmetrical space, so that the eddy current induced in the static coil unit 151 has an asymmetrical distribution. For example, a smaller magnitude of eddy current than that induced in the reference state is induced in portions of the static coil unit 151, corresponding to the excessive spaces 159 (see FIG. 13), and a greater magnitude of eddy current than that induced in the reference state is induced in the other portions of the static coil unit 151, corresponding to the other spaces, so that asymmetry of an eddy current distribution is caused.

The problem of asymmetry of eddy current distribution can be overcome according to the present invention by adjusting the magnitude of eddy current asymmetrically distributed by the asymmetrical spaces. For example, symmetry of eddy current distribution can be restored (or achieved in the first place) by increasing the magnitude of eddy current induced in portions of the static coil unit 151 that corresponds to the excessive spaces 159 of the asymmetrical spaces.

In other words, if the conductors 157 are installed in the excessive spaces 159 as shown in FIGS. 10 and 14, eddy current is induced in the conductors 157 due to electromagnetic induction, and the eddy current induced in the conductors 157 is added to eddy current induced in portions of the magnetostatic coil unit 151, corresponding to areas in which the conductors 157 are installed, thus increasing the magnitude of eddy current induced in the static coil unit 151.

As such, if the conductors 157 are disposed in the excessive spaces 159, the magnitude of eddy current induced in portions of the static coil unit 151, corresponding to the excessive space 159, increases so that the magnitude of eddy current of the excessive spaces 159 can have a symmetrical distribution with eddy current induced in the other spaces.

Locations at which the conductors 157 are disposed may be determined to locations at which eddy current induced in the static coil unit 151 is asymmetrically distributed, when the eddy current is measured and a distribution of the eddy current is obtained.

For example, if the magnitude of eddy current measured at a certain area is smaller than the magnitude of eddy current measured at another area symmetrical to the area, the corresponding area may be determined to be an area at which the conductors 157 have to be disposed/arranged/positioned. The area may belong to the excessive areas 159 that are made when the static coil unit 151 and the gradient coil unit 152 are deviated from the reference state. As described above, since the asymmetrical distribution of eddy current is not necessarily made only when the static coil unit 151 and the gradient coil unit 152 are deviated from the reference state, the conductors 157 may be installed at arbitrary locations in the asymmetrical spaces between the static coil unit 151 and the gradient coil unit 152, as well as the excessive spaces 159, as long as the asymmetry of the eddy current distribution can be eliminated by installing the conductors 157 at the locations.

Also, the number of the conductors 157 may depend on the number of locations at which eddy current is asymmetrically distributed. If asymmetrical distributions of eddy current have been checked from a plurality of locations on the static coil unit 151, conductors 157 corresponding to the number of the checked locations may be installed at the corresponding locations in order to restore the asymmetrical distributions of the eddy current at the corresponding locations to symmetrical distributions.

After the locations and number of the conductors 157 are determined, the number or size of conductors 157 that are to be disposed at each location may be determined.

Since the smaller magnitude of eddy current is measured at a location at which a conductor 157 is to be installed, the higher edgy current has to be added to the corresponding location, the size of a conductor 157 which is to be installed at a location may be determined according to the magnitude of eddy current measured at the corresponding location.

According to test results, when the thickness (a) of conductors 157 is, for example, 1 mm and the length (b) of the conductors 157 is, for example, 30 mm (see FIGS. 10 and 14), eddy current induced in the conductors 157 was measured to be 4 to 5 times higher than eddy current induced in the thermal shield of the static coil unit 151. Accordingly, if the magnitude of eddy current that has to be added for restoring a symmetrical distribution of eddy current is calculated, the size of conductors 157 may be determined based on data acquired according to the test results.

Also, the sizes or shapes of conductors 157 may be determined according to areas on which the conductors 157 are to be installed, or the numbers of the conductors 157 that are to be disposed at the individual areas may be determined.

In order to cover each area, a single conductor 157 may be disposed at the corresponding location. However, it is also within the spirit and scope of the present invention to position a plurality of conductors 157 each having a predetermined size at each location in order to distributively cover an area of the corresponding location.

Also, the conductors 157 may be formed in the shape of a flat plate or in the shape of a curved structure according to the shapes of areas on which the conductors 157 are installed. In the current exemplary embodiment, since the static coil unit 151 is in the shape of a cylinder, the conductors 157 each may be fabricated in the shape of a curved structure having a curvature equal or similar to that of the static coil unit 151 and arranged on the static coil unit 151 if the conductors 157 are disposed over a wide area.

As described above, if eddy current of the static coil unit 151 is measured, and areas at which the eddy current is asymmetrically distributed are determined, the installation locations, size, shape, number, etc. of the conductors 157 are determined such that symmetry of an eddy current distribution can be restored.

If the installation location, number, size, and shape of conductors 157 are determined based on the results of the measurement on the eddy current induced in the static coil unit 151, conductors 157 satisfying the determined conditions are disposed at the installation locations (530).

As described above, if eddy current of the static coil unit 151 is measured, and areas at which the eddy current is asymmetrically distributed are determined, the installation locations, size, shape, number, etc. of the conductors 157 are determined, and the conductors 157 are disposed at the installation locations according to the determined conditions so that symmetry of an eddy current distribution can be restored or achieved.

If the eddy current restores a symmetrical distribution, the pre-emphasis method or another existing method for cancelling influence of eddy current can be used to cancel influence of the eddy current.

The conductors 157 may be made of aluminum (Al), copper (Cu), stainless steel (SUS), etc. However, materials that can be used for fabricating the conductors 157 are not limited to the above-mentioned materials.

If the conductors 157 are disposed at the installation locations, the eddy current of the static coil unit 151 is again measured, and it is determined whether the eddy current has a symmetrical distribution. That is, the process returns to operation 500 to measure eddy current induced in the static coil unit 151 and calculate a distribution in magnitude of the eddy current induced in the static coil unit 151. By measuring the eddy current and calculating a distribution in magnitude of the eddy current, it is determined whether the eddy current has a symmetrical distribution, and if it is determined that the eddy current has a symmetrical distribution, the process is terminated.

The above-described exemplary according to the present invention can be implemented in hardware, firmware or via the execution of software or computer code that configures hardware for operation, and is stored on a non-transitory machine readable medium such as a CD ROM, DVD, RAM, a floppy disk, a hard disk, or a magneto-optical disk, such as a floptical disk or computer code downloaded over a network originally stored on a remote recording medium or a non-transitory machine readable medium and stored on a local non-transitory recording medium, so that the methods described herein can be loaded into hardware such as a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. In addition, an artisan understands and appreciates that a "processor" or "microprocessor" comprise hardware in the claimed invention. Under the broadest reasonable interpretation, the appended claims constitute statutory subject matter in compliance with 35 U.S.C. §101. The terms "unit" or "module" as used herein is to be understood under the broadest reasonable interpretation as constituting statutory subject matter under 35 U.S.C. §101 that includes hardware and does not constitute software per se. When a unit or module includes machine executable code it is to be understood that a non-transitory machine readable medium contains the machine executable code that is loaded into hardware such as a processor or controller for execution and configures the processor or controller for operation.

Although a few embodiments of the present invention have been shown and described, those skilled in the art understand and appreciate that changes may be made in these embodiments without departing from the principles and spirit of the invention, the scope of which is defined in the claims and their equivalents.

What is claimed is:

1. A magnetic resonance imaging (MRI) apparatus comprising:
   a static coil unit configured to form a static field in a subject;
   a gradient coil unit configured to form a gradient field in the static field; and
   one or more conductors installed in the space between the static coil unit and the gradient coil unit, and configured for symmetrically distributing eddy current induced in the static coil unit, wherein the one or more conductors are installed in an asymmetrical space that is formed when the gradient coil unit is deviated from a reference state in which the gradient coil unit forms a concentric body with the static coil unit and are arranged for adjusting the magnitude of the eddy current induced in the static coil unit.

2. The MRI apparatus according to claim 1, wherein the one or more conductors are installed in an excessive space that is formed when the gradient coil unit deviates in position from a reference state in which the gradient coil unit forms a concentric body with the static coil unit and are arranged for adjusting the magnitude of the eddy current induced in a portion of the static coil unit corresponding to the excessive space.

3. The MRI apparatus according to claim 2, wherein the excessive space includes an area in which the space between the gradient coil unit and the static coil unit is widened when the gradient coil unit has deviated from the reference state.

4. The MRI apparatus according to claim 1, wherein the one or more conductors are installed at a location for symmetrically distributing the magnitude of the eddy current induced in the static coil unit and asymmetrically distributed in at least one direction among x-, y-, and z-axis directions.

5. The MRI apparatus according to claim 1, wherein the conductors are made of at least one material selected from the group consisting of copper (Cu), aluminum (Al), and stainless steel (SUS).

6. The MRI apparatus according to claim 1, wherein the static coil unit includes one or more installation units in which the conductors are installed.

7. The MRI apparatus according to claim 1, wherein at least one of the size and number of the conductors are determined based on the results of one or more measurements on the eddy current induced in the static coil unit.

8. The MRI apparatus according to claim 7, wherein the conductors are installed in an area of the static coil unit in which a measured magnitude of eddy current is smaller than a magnitude of eddy current measured at the other area of the static coil unit, and the smaller magnitude of the eddy current measured in the area or the larger size of the area results in the larger size of the conductors that is installed in the area or a greater quantity of the conductors.

9. The MRI apparatus according to claim 1, wherein the shape of the conductors is determined based on the shape of an area in which the conductors are installed.

10. A manufacturing method of a magnetic resonance imaging (MRI) apparatus, comprising:
measuring eddy current formed in a static coil unit;
determining a location at which one or more conductors are to be installed in order to form a symmetrical distribution of the eddy current induced in the static coil unit, based on a result of the measurement; and
installing the one or more conductors in the determined location, wherein an installation location of the one or more conductors includes an asymmetrical mace that is formed when a gradient coil unit has deviated from a position in a reference state at which the gradient coil unit forms a concentric body with the static coil unit.

11. The manufacturing method according to claim 10, wherein the installation location of the one or more conductors includes an excessive space between the gradient coil unit and the static coil unit, the excessive space being formed when the gradient coil unit is deviated from a reference state in which the gradient coil unit forms a concentric body with the static coil unit.

12. The manufacturing method according to claim 11, wherein the excessive space includes an area in which the space between the gradient coil unit and the static coil unit has widened when the gradient coil unit has deviated from the reference state.

13. The manufacturing method according to claim 10, wherein the installation location of the one or more conductors includes an area of the static coil unit in which a smaller magnitude of eddy current is measured in an asymmetrical distribution of eddy current of the static coil unit, the asymmetrical distribution appearing in at least one direction among x-, y-, and z-axis directions.

14. The manufacturing method according to claim 10, wherein the one or more conductors are made of at least one material selected from the group consisting of copper (Cu), aluminum (Al), and stainless steel (SUS).

15. The manufacturing method according to claim 10, wherein the static coil unit includes one or more installation units in which the one or more conductors are installed, and the installing of the one or more conductors in the determined location comprises installing the conductors in the installation units of an magnetic coil unit, installed in the determined installation location.

16. The manufacturing method according to claim 10, wherein at least one of the size and number of the one or more conductors for forming the symmetrical distribution of the eddy current induced in the static coil unit is determined based on the results of the measurement.

17. The manufacturing method according to claim 16, wherein the determining of the at least one of the size and number of the one or more conductors comprises increasing the size or number of the conductors that are installed in the installation location, as a smaller magnitude of eddy current is measured in the installation location of the conductors determined based on the result of the measurement, or when the installation location is determined to a larger area.

18. The manufacturing method according to claim 10, further comprising determining the shape of the one or more conductors according to a shape of the installation location of the conductors determined based on the result of the measurement.

* * * * *